US008549718B2

(12) United States Patent
Kobayashi et al.

(10) Patent No.: US 8,549,718 B2
(45) Date of Patent: Oct. 8, 2013

(54) FERROELECTRIC OXIDE STRUCTURE, METHOD FOR PRODUCING THE STRUCTURE, AND LIQUID-DISCHARGE APPARATUS

(71) Applicant: FUJIFILM Corporation, Tokyo (JP)

(72) Inventors: Hiroyuki Kobayashi, Kanagawa-ken (JP); Yukio Sakashita, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/621,556

(22) Filed: Sep. 17, 2012

(65) Prior Publication Data

US 2013/0022736 A1 Jan. 24, 2013

Related U.S. Application Data

(62) Division of application No. 12/473,621, filed on May 28, 2009, now abandoned.

(30) Foreign Application Priority Data

May 29, 2008 (JP) ................................ 2008-140972

(51) Int. Cl.
*H01L 41/22* (2013.01)
*H04R 17/00* (2006.01)
*B41J 2/045* (2006.01)

(52) U.S. Cl.
USPC .......................................... 29/25.35; 347/68

(58) Field of Classification Search
None
See application file for complete search history.

(56) References Cited

U.S. PATENT DOCUMENTS

| | | | | |
|---|---|---|---|---|
| 7,804,231 | B2 * | 9/2010 | Ifuku et al. | 310/358 |
| 2003/0106489 | A1 * | 6/2003 | Lung et al. | 117/84 |
| 2008/0012054 | A1 | 1/2008 | Ifuku et al. | |

FOREIGN PATENT DOCUMENTS

| | | | |
|---|---|---|---|
| JP | 7-300397 | A | 11/1995 |
| JP | 2003-89597 | A | 3/2003 |
| JP | 2005-119166 | A | 5/2005 |
| JP | 2006-245141 | A | 9/2006 |
| WO | WO 2007/029580 | A1 | 3/2007 |

OTHER PUBLICATIONS

Zhang et al., "In situ observation of reversible domain switching in aged Mn-doped Ba Ti03 single crystals", Physical Review B 71, pp. 174108-1-174108-8, 2005.

Japanese Office Action, dated Jan. 22, 2013 for Japanese Application No. 2008-140972.

* cited by examiner

*Primary Examiner* — Matthew Luu
*Assistant Examiner* — Erica Lin
(74) *Attorney, Agent, or Firm* — Birch, Stewart, Kolasch & Birch, LLP.

(57) ABSTRACT

A ferroelectric oxide structure includes a substrate and a ferroelectric thin-film deposited on the substrate. The ferroelectric thin-film has a thickness of greater than or equal to 200 nm and a tetragonal crystal system. The ferroelectric thin-film has (100) single-orientation crystal orientation.

3 Claims, 6 Drawing Sheets

FERROELECTRIC OXIDE STRUCTURE, METHOD FOR PRODUCING THE STRUCTURE, AND LIQUID-DISCHARGE APPARATUS

CROSS REFERENCE TO RELATED APPLICATIONS

This application is a Divisional of copending application Ser. No. 12/473,621 filed on May 28, 2009, which claims priority to Application No. 140972/2008 filed in JP, on May 29, 2008. The entire contents of all of the above applications is hereby incorporated by reference.

BACKGROUND OF THE INVENTION

1. Field of the Invention

The present invention relates to a ferroelectric oxide structure, such as a ferroelectric element, and a liquid discharge apparatus using the ferroelectric oxide structure. Further, the present invention relates to a method for producing the ferroelectric oxide structure.

2. Description of the Related Art

A piezoelectric element including a piezoelectric body and electrodes for applying an electric field to the piezoelectric body is used as a piezoelectric actuator or the like, which is mounted on an inkjet-type recording head, an atomic force microscope (AFM), a camera module of a cellular phone, an ultrasonic wave device or the like. The piezoelectric body has piezoelectric properties, in other words, expands or contracts as the strength of the electric field applied to the piezoelectric body changes. In recent years, a need for reducing the sizes of various kinds of electronic devices and a need for highly densely integrating various kinds of electronic devices have increased. Therefore, some attempts have been made to reduce the thicknesses of the electronic devices by structuring the electronic devices as thin-film deposition structures. Further, a structure including a piezoelectric thin-film is used in a piezoelectric element. In such a structure, it is desirable that thickness of the piezoelectric thin-film is greater than or equal to 200 nm to obtain efficient piezoelectric properties. Further, it is more desirable that the thickness of the piezoelectric thin-film is greater than or equal to 500 nm.

As the piezoelectric material, a perovskite-type oxide, such as lead titanate zirconate (PZT), is widely used. Such a piezoelectric material is a ferroelectric material that spontaneously polarizes when no electric field is applied to the piezoelectric material.

Lead-based perovskite-type oxides, such as PZT, are most widely used among piezoelectric materials. The lead-based perovskite-type oxides are known to have a large ordinary electric-field-induced piezoelectric strain, in which the piezoelectric material expands or contracts in the direction of the application of the electric field as the strength of the applied electric field changes.

Recently, there is growing concern about loads on the environment, and restriction on the use of lead is started also in material fields, such as RoHs regulation in Europe. However, with regard to piezoelectric materials, the piezoelectric properties of lead-free piezoelectric materials are insufficient, compared with the piezoelectric properties of lead-based piezoelectric materials. Therefore, the piezoelectric materials are excluded from the regulations. Hence, a lead-free piezoelectric material that has excellent piezoelectric properties similar to those of the lead-based piezoelectric material needs to be developed.

In lead-free piezoelectric materials, a strain displacement amount is limited if only the aforementioned ordinary electric-field-induced piezoelectric strain is utilized. Therefore, a piezoelectric element utilizing reversible non-180-degree domain rotation, such as 90-degree domain rotation, has been proposed. In such a piezoelectric element, when the piezoelectric material has a tetragonal crystal system, it is possible to obtain both of a piezoelectric strain that is obtained by 90-degree domain rotation of a-domains to c-domains and an ordinary electric-field-induced piezoelectric strain obtained after the domain rotation. In the a-domains, a-axes are oriented in the direction of application of the electric field, and in the c-domains, c-axes are oriented in the direction of the application of the electric field. The a-domains rotate to the c-domains by application of the electric field.

L. X. Zhang and X. Ren, "In situ observation of reversible domain switching in aged Mn-doped $BaTiO_3$ single crystals", Physical Review B 71, pp. 174108-1-174108-8, 2005 (Non-Patent Literature 1) discloses a piezoelectric material in which movable point defects are arranged in a single crystal of barium titanate having c-axis orientation ((001) orientation) in such a manner that the short-range order symmetry of the point defects becomes the same as the crystalline symmetry of a ferroelectric phase. Further, Non-Patent Literature 1 has reported that in this material, a tetragonal crystal phase of a-domain structure ((100) orientation) in which the spontaneous polarization axis and the direction of the application of the electric field are shifted by 90 degrees is formed, and that reversible 90-degree domain rotation of this domain occurs. However, in the piezoelectric material disclosed in Non-Patent Literature 1, a-domains are present in c-domains in a mixed state. Therefore, the ratio of the a-domains is low, and a sufficient domain-rotation effect is not achieved. The domain-rotation effect of the piezoelectric material that has a tetragonal crystal system is most efficiently achieved when the piezoelectric material has a-axis single-orientation ((100) single orientation).

Further, Japanese Unexamined Patent Publication No. 7 (1995)-300397 (Patent Literature 1) discloses a ferroelectric thin-film element including a ferroelectric thin-film deposited on a substrate. In Patent Literature 1, the average thermal expansion coefficient of the substrate from room temperature to the deposition temperature of the ferroelectric thin-film is less than or equal to $50\times10^{-7}$° $C.^{-1}$, and the ferroelectric thin-film is strongly oriented in <100> direction.

Patent Literature 1 (Example 1 and the like) describes, in Example 1, that lead lanthanide titanate thin-films are deposited on substrates that have different average thermal expansion coefficients from each other by using a high-frequency magnetron method, and that the difference in the average thermal expansion coefficients of the substrates influences the crystal orientation of each of the thin-films (thickness is fpm) deposited on the substrates (FIG. 1). Further, Patent Literature 1 describes that when the average thermal expansion coefficient of the substrate is less than or equal to $50\times10^{-7}$° $C.^{-1}$, the thin-film is strongly oriented in <100> direction. However, in the XRD illustrated in FIG. 1 of Patent Literature 1, an orientation peak in <001> direction is observed in each of (A) through (C), which are judged to be strongly oriented in <100> direction. Therefore, a single-orientation thin-film has not been obtained (the degree of orientation estimated from the XRD spectrum is approximately 80%).

SUMMARY OF THE INVENTION

In view of the foregoing circumstances, it is an object of the present invention to provide a ferroelectric oxide structure including a (100) single-orientation ferroelectric thin-film that has a thickness of greater than or equal to 200 nm and tetragonal system crystal structure.

Further, it is another object of the present invention to provide a method for producing a ferroelectric oxide structure including a (100) single-orientation ferroelectric thin-film that has a thickness of greater than or equal to 200 nm and tetragonal system crystal structure.

A ferroelectric oxide structure according to the present invention is a ferroelectric oxide structure comprising:

a substrate; and a ferroelectric thin-film (film or coating or the like) having a thickness of greater than or equal to 200 nm and a tetragonal crystal system, the ferroelectric thin-film being (directly or indirectly) deposited on the substrate, wherein the ferroelectric thin-film has (100) single-orientation crystal orientation.

In the specification of the present application, the expression "the ferroelectric thin-film has (100) single-orientation crystal orientation" means that in θ/2θ X-ray diffraction measurement (XRD) of the ferroelectric thin-film, the Lotgerling degree F. of orientation of (100) plane represented by the following formula (i) is greater than or equal to 90%:

$$F(\%)=(P-P0)/(1-P0)\times 100 \quad (1).$$

Here, the term "(100) plane" is a general term representing equivalent planes, such as (100) plane and (200) plane. Further, in formula (i), P is the ratio of the sum of reflection intensities from an orientation plane to the sum of total reflection intensities. When the ferroelectric thin-film has (100) crystal orientation, P is the ratio ({ΣI(100)/ΣI(hkl)}), which is the ratio of the sum ΣI (100) of the reflection intensities I(100) from (100) plane to the sum ΣI (hkl) of reflection intensities I(hkl) from each of crystal planes I(hkl). For example, in a perovskite crystal that has (100) crystal orientation, P=I(100) [I(001)+I(100)+I(101)+I(110)+I(111)]. Further, in formula (i), P0 is the value of P of a sample that has completely random orientation. When the sample has completely random orientation (P=P0), F=0%. When the sample has complete orientation (P=1), F=100%.

A ferroelectric oxide structure according to the present invention may optionally satisfy the following formula (2) when the ferroelectric thin-film satisfies the following formula (1):

$$1.0<(c/a)_{film}\leq 1.015 \quad (1); \text{ and}$$

$$\alpha_{film}-\alpha_{sub}(^\circ\,\text{C.}^{-1})\geq 3.0\times 10^{-6} \quad (2).$$

A ferroelectric oxide structure according to the present invention may optionally satisfy the following formula (4) when the ferroelectric thin-film satisfies the following formula (3);

$$1.015<(c/a)_{film}\leq 1.045 \quad (3); \text{ and}$$

$$\alpha_{film}-\alpha_{sub}(^\circ\,\text{C.}^{-1})\geq 9.0\times 10^{-6} \quad (4).$$

A ferroelectric oxide structure according to the present invention may optionally satisfy the following formula (6) when the ferroelectric thin-film satisfies the following formula (5):

$$1.045<(c/a)_{film}\leq 1.065 \quad (5); \text{ and}$$

$$\alpha_{film}-\alpha_{sub}(^\circ\,\text{C.}^{-1})\geq 12.0\times 10^{-6} \quad (6).$$

In formulas (1) through (6), $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film.

In the specification of the present application, the term "thermal expansion coefficient" refers to an average thermal expansion coefficient from room temperature to the deposition temperature.

Further, a ferroelectric oxide structure according to the present invention may optionally satisfy the following formula (7):

$$(\alpha_{film}-\alpha_{sub}(^\circ\,\text{C.}^{-1}))\times(Tg-Tc(^\circ\,\text{C.}))/(c/a)_{film}>25\times 10^{-4} \quad (7).$$

Further optionally, the ferroelectric oxide structure according to the present invention may satisfy the following formula (8):

$$(\alpha_{film}-\alpha_{sub}(^\circ\,\text{C.}^{-1}))\times(Tg-Tc(^\circ\,\text{C.}))/(c/a)_{film}\geq 30\times 10^{-4} \quad (8).$$

In formulas (7) and (8), $\alpha_{sub}$ is the thermal expansion coefficient of the substrate, $\alpha_{film}$ is the thermal expansion coefficient of the ferroelectric thin-film, Tg is the deposition temperature of the ferroelectric thin-film, Tc is a phase-transition temperature, and $(c/a)_{film}$ is the lattice constant ratio of the crystal axes of the ferroelectric thin-film.

In the ferroelectric oxide structure of the present invention, the ferroelectric oxide thin-film may contain at least one kind of perovskite-type oxide selected from the group consisting of barium titanate, barium strontium titanate, barium titanate zirconate, bismuth potassium titanate, and bismuth ferrites.

The ferroelectric oxide thin-film may contain lead titanate zirconate.

The ferroelectric oxide thin-film contains lead titanate.

In the ferroelectric oxide structure of the present invention, the substrate may contain Si as a main component. Here, the term "main component" is defined as a component having a content of 80 mole % or higher.

Further, it is desirable that the substrate is a single-crystal substrate. Further, it is desirable that the ferroelectric thin-film is an epitaxial layer (epitaxial thin-film).

Further, when a crystal plane at a surface of the substrate is formed by off-cutting the substrate from a low-index plane of the substrate, and such a substrate is used, the ferroelectric thin-film has substantially uniform crystal orientation in a plane parallel to the crystal plane.

In the specification of the present application, the term "low-index plane" is defined as a plane represented by (abc) plane (each of a, b and c is 0 or 1, and a+b+c≥1).

Further, the ferroelectric oxide structure of the present invention may be a ferroelectric element having electrodes that apply an electric field to the ferroelectric thin-film in the direction of the thickness of the ferroelectric thin-film.

A liquid discharge apparatus according to the present invention is a liquid discharge apparatus comprising:

a piezoelectric element composed of the ferroelectric oxide structure of the present invention; and a liquid discharge member provided next to the piezoelectric element, wherein the liquid discharge member includes a liquid reservoir for storing liquid and a liquid outlet (a liquid discharge opening) for discharging the liquid from the liquid reservoir to the outside of the liquid reservoir based on the electric field applied to the piezoelectric element.

A first method for producing a ferroelectric oxide structure according to the present invention is a method for producing a ferroelectric oxide structure that has a substrate and a ferroelectric thin-film deposited on the substrate, wherein the crystal structure of the ferroelectric thin-film undergoes phase-transition at a predetermined temperature, and wherein the ferroelectric thin-film has a thickness of greater than or equal to 200 nm and a tetragonal crystal system when the temperature of the ferroelectric thin-film is less than or equal to the predetermined temperature, the method comprising the steps of:

preparing the substrate that satisfies the following formula (2) based on the thermal expansion coefficient of the ferroelectric thin-film when the ferroelectric thin-film satisfies the following formula (1);

preparing the substrate that satisfies the following formula (4) based on the thermal expansion coefficient of the ferroelectric thin-film when the ferroelectric thin-film satisfies the following formula (3);

preparing the substrate that satisfies the following formula (6) based on the thermal expansion coefficient of the ferroelectric thin-film when the ferroelectric thin-film satisfies the following formula (5); and depositing the ferroelectric thin-film on the substrate at a temperature higher than or equal to the predetermined temperature, wherein the formulas (1) through (6) are $$1.0<(c/a)_{film}\leq 1.015 \quad (1),$$

$$\alpha_{film}-\alpha_{sub}(° C.^{-1})\geq 3.0\times 10^{-6} \quad (2),$$

$$1.015<(c/a)_{film}\leq 1.045 \quad (3),$$

$$\alpha_{film}-\alpha_{sub}(° C.^{-1})\geq 9.0\times 10^{-6} \quad (4),$$

$$1.045<(c/a)_{film}\leq 1.065 \quad (5),$$

$$\alpha_{film}-\alpha_{sub}(° C.^{-1})\geq 12.0\times 10^{-6} \quad (6),$$

where $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film in formulas (1) through (6).

A second method for producing a ferroelectric oxide structure according to the present invention is a method for producing a ferroelectric oxide structure that has a substrate and a ferroelectric thin-film deposited on the substrate, wherein the crystal structure of the ferroelectric thin-film undergoes phase-transition at a predetermined temperature, and wherein the ferroelectric thin-film has a thickness of greater than or equal to 200 nm and a tetragonal crystal system when the temperature of the ferroelectric thin-film is less than or equal to the predetermined temperature, the method comprising the steps of:

preparing the substrate that satisfies the following formula (7) or optionally the substrate that satisfies the following formula (8), based on the thermal expansion coefficient of the ferroelectric thin-film and the lattice constant ratio of the crystal axes of the ferroelectric thin-film; and depositing the ferroelectric thin-film on the substrate at a temperature higher than or equal to the predetermined temperature, wherein the formulas (7) and (8) are $$\alpha_{film}-\alpha_{sub}(° C.^{-1})\times(Tg-Tc(° C.))/(c/a)_{film}>25\times 10^{-4} \quad (7), \text{ and}$$

$$(\alpha_{film}-\alpha_{sub}(° C.^{-1})\times(Tg-Tc(° C.))/(c/a)_{film}\geq 30\times 10^{-4} \quad (8),$$

where $\alpha_{sub}$ is the thermal expansion coefficient of the substrate, $\alpha_{film}$ is the thermal expansion coefficient of the ferroelectric thin-film, Tg is the deposition temperature of the ferroelectric thin-film, Tc is a phase-transition temperature, and $(c/a)_{film}$ is the lattice constant ratio of the crystal axes of the ferroelectric thin-film in formulas (7) and (8).

Meanwhile, paragraph [0010] of Patent Literature 1 describes that when a perovskite-type oxide thin-film, such as lead titanate, is obtained by depositing the thin-film at a temperature higher than or equal to Curie temperature and by cooling the deposited thin-film through the Curie temperature, if the thermal expansion coefficient of the substrate is higher than the thermal expansion coefficient of the thin-film, thermal compression stress is applied to the thin-film in the process of cooling. Therefore, c-domains sharply increase in such a manner that the thin-film is oriented in a direction that reduces strain energy when phase-transition to tetragonal crystal occurs at the Curie temperature, in other words, in such a manner that <001> axis is oriented in a direction perpendicular to the substrate surface. In Patent Literature 1, such finding was applied to <100> crystal orientation to obtain a ferroelectric thin-film element including a ferroelectric thin-film that is strongly oriented in <100> direction.

Therefore, Patent Literature 1 is similar to the present invention in that a-domains are increased by stress generated by a difference between the thermal expansion coefficient of the substrate and the thermal expansion coefficient of the thin-film deposited on the substrate. However, as described in "Description of the Related Art" in the specification of the present application, a single-orientation thin-film is not obtained in Patent Literature 1 (the degree of orientation is approximately 80%).

In contrast, in the present invention, the conditions of the ferroelectric thin-film and the substrate required to obtain the ferroelectric thin-film having (100) single orientation have been discovered in the ferroelectric oxide structure that includes the substrate and the ferroelectric thin-film having a thickness of greater than or equal to 200 nm and a tetragonal crystal system, and which is deposited on the substrate. Further, these conditions have been applied to the present invention. Meanwhile, Patent Literature 1 fails to teach or suggest any conditions or guidelines for obtaining the ferroelectric thin-film that has single orientation.

The ferroelectric oxide structure according to the present invention includes a substrate and a ferroelectric thin-film that has a thickness of greater than or equal to 200 nm and a tetragonal crystal system, and the ferroelectric thin-film is deposited on the substrate. Further, the ferroelectric thin-film has (100) single-orientation crystal orientation. Further, in the ferroelectric oxide structure that is structured as described above, the crystal orientation of a ferroelectric thin-film that has a thickness of greater than or equal to 500 nm and a tetragonal crystal system is (100) single-orientation. Therefore, it is possible to maximize the functions of the ferroelectric thin-film that are realized by the (100) single-orientation of the thin-film, and the functions realized by the (100) single-orientation are an effect obtained by non-180-degree domain rotation, such as 90-degree domain rotation, and the like. Therefore, in a ferroelectric oxide structure, such as a ferroelectric element, that should desirably include a ferroelectric thin-film having a thickness of greater than or equal to 200 nm and a tetragonal crystal system because of the device characteristics, it is possible to optimize the device characteristics based on (100) single orientation. The examples of the ferroelectric element are a piezoelectric element, a pyroelectric element and the like.

Further, the method for producing the ferroelectric oxide structure according to the present invention has been obtained by discovering that when a ferroelectric thin-film that has a thickness of greater than or equal to 200 nm and a tetragonal crystal system is deposited on a substrate, it is possible to deposit a ferroelectric thin-film that has (100) single-orientation by optimizing the difference between the thermal compression stress of the substrate and the thermal compression stress of the ferroelectric thin-film and the difference between the thermal expansion coefficient of the substrate and the thermal expansion coefficient of the ferroelectric thin-film.

According to the method for producing the ferroelectric oxide structure of the present invention, in a ferroelectric element, such as a piezoelectric element and a pyroelectric element, that should desirably include a ferroelectric thin-film having a thickness of greater than or equal to 200 nm and a tetragonal crystal system because of the device characteristics, it is possible to obtain a ferroelectric thin-film that has (100) single orientation.

DESCRIPTION OF THE PREFERRED EMBODIMENTS

"Piezoelectric Element (Ferroelectric Element and Ferroelectric Oxide Structure) and Inkjet-Type Recording Head"

Figure 1:
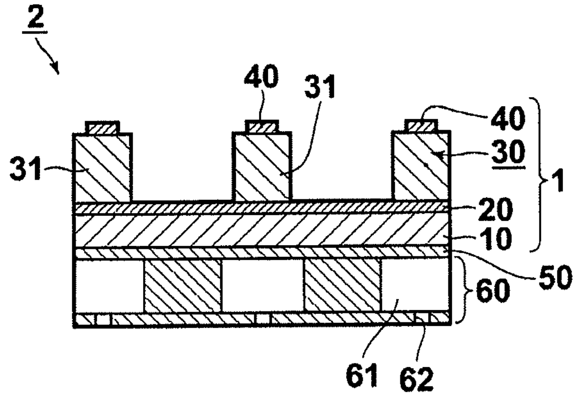
FIG. 1 is a sectional diagram illustrating the structure of a piezoelectric element and an inkjet-type recording head (a liquid discharge apparatus) according to an embodiment of the present invention.
Figure 2:
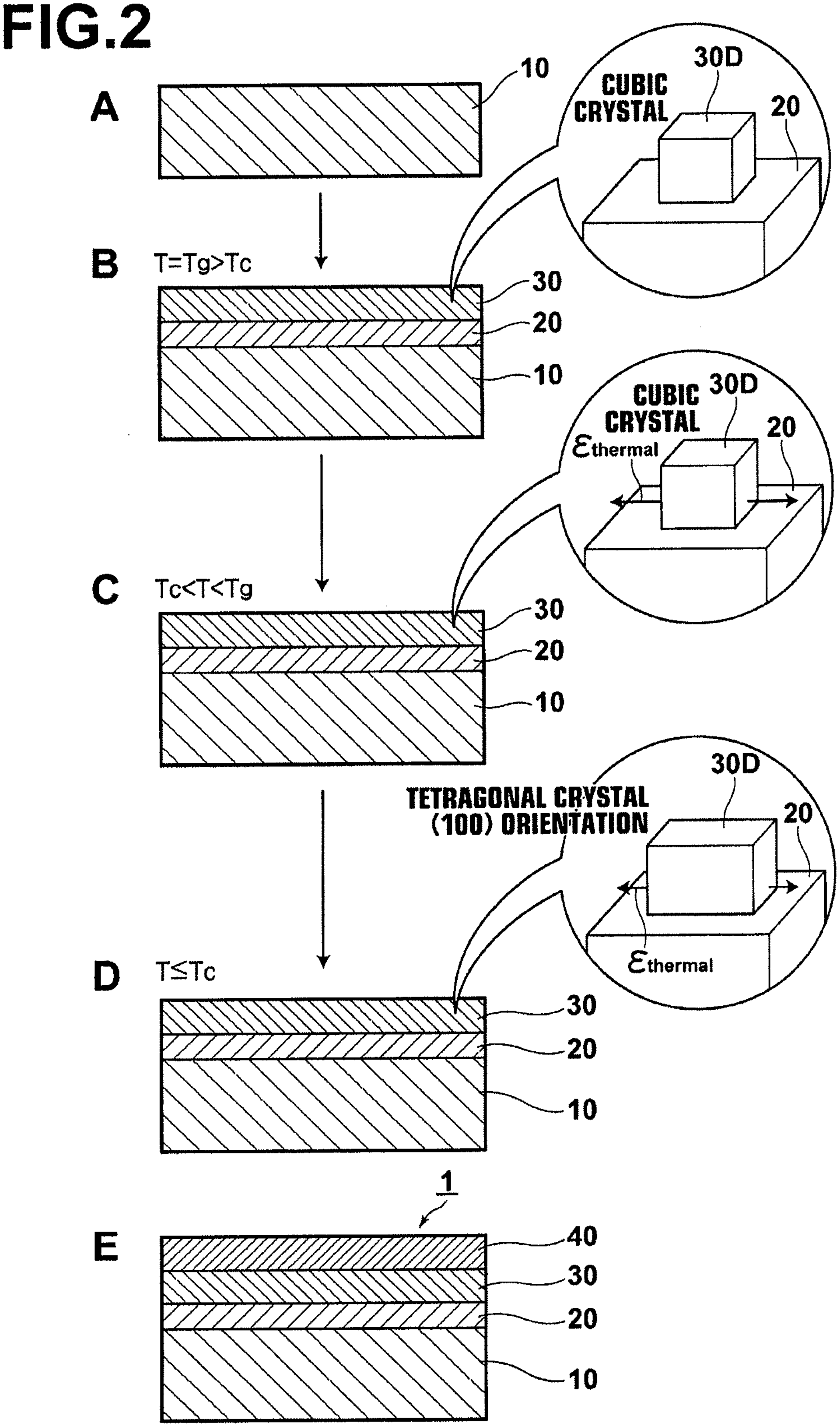
FIG. 2 is a schematic diagram illustrating steps A through E in production of a ferroelectric oxide structure of the present invention.

With reference to FIG. 1, the structure of a piezoelectric element (a ferroelectric element and a ferroelectric oxide structure) according to an embodiment of the present invention will be described. Further, the structure of an inkjet-type recording head (a liquid discharge apparatus) including the piezoelectric element of the present invention will be described. FIG. 2 is a sectional diagram illustrating the main part of the inkjet-type recording head (a sectional diagram in the thickness direction of the piezoelectric element). In FIGS. 1 and 2, the elements are illustrated in different scale from the actual sizes thereof so as to be easily recognized.

As illustrated in FIG. 1, a piezoelectric element (a ferroelectric element and a ferroelectric oxide structure) 1 includes a substrate 10, a lower electrode 20, a piezoelectric thin-film (ferroelectric thin-film) 30, and an upper electrode 40. The lower electrode 20, the piezoelectric thin-film 30, and the upper electrode 40 are sequentially deposited on the substrate 10, and the piezoelectric thin-film 30 has a thickness of greater than or equal to 200 nm and tetragonal crystal structure. Further, an electric field is applied to the piezoelectric thin-film 30 in the thickness direction of the piezoelectric thin-film 30 by the lower electrode 20 and the upper electrode 40. Further, various kinds of function layers, such as a buffer layer 50, may be provided between the piezoelectric thin-film 30 and each of the electrodes.

The lower electrode 20 is formed on the substantially entire surface of the substrate 10. Further, the piezoelectric thin-film 30 is formed on the lower electrode 20. The piezoelectric thin-film 30 includes linear projections 31 extending from the front side of FIG. 1 to the back side of FIG. 1, and the linear projections 31 are arranged in a striped pattern. Further, the upper electrode 40 is formed on each of the projections 31.

The pattern of the piezoelectric thin-film 30 is not limited to the pattern illustrated in FIG. 1, and it may be appropriately designed. The piezoelectric thin-film 30 may be a continuous thin-film. However, when the piezoelectric thin-film 30 is not a continuous thin-film but a thin-film having a pattern composed of a plurality of projections 31 that are apart from each other, the expansion and contraction of each of the projections 31 occurs smoothly. Therefore, a greater amount of displacement is obtained, and that is desirable.

The inkjet-type recording head (liquid discharge apparatus) 2 is substantially structured by attaching an ink nozzle (a liquid storage/discharge member) 60 to the lower surface of the substrate 10 of the piezoelectric element 1, which is structured as described above. The ink nozzle 60 is attached to the lower surface of the substrate 10 through a vibration plate 50, and the ink nozzle 60 includes an ink chamber (a liquid reservoir) 61 for storing ink and an ink outlet (a liquid discharge opening) 62 for outputting the ink from the ink chamber 61 to the outside of the ink chamber 61. A plurality of ink chambers 61 are provided in such a manner to correspond to the number of the projections 31 of the piezoelectric thin-film 30 and the pattern of the piezoelectric thin-film 30.

In the inkjet-type recording head 2, the strength of the electric field applied to each of the projections 31 of the piezoelectric element 1 is changed (increased or decreased) to make the projections 31 expand or contract. Accordingly, the timing of discharge and the amount of ink discharged from the ink chamber 61 are controlled.

In the piezoelectric element 1, the main component of the lower electrode 20 is not particularly limited. The lower electrode 20 may contain, as the main component, a metal or a metal oxide, such as Au, Pt, Ir, $IrO_2$, $RuO_2$, $LaNiO_3$, and $SrRuO_3$, and a combination thereof.

Further, the main component of the upper electrode 40 is not particularly limited. The upper electrode 40 may contain, as the main component, the aforementioned materials of the lower electrode 20, an electrode material, such as Al, Ta, Cr, or Cu, which is generally used in semiconductor process, and a combination thereof.

Further, the thicknesses of the lower electrode 20 and the thickness of the upper electrode 40 are not particularly limited. For example, the thicknesses may be approximately 200 nm. It is desirable that the thickness of the piezoelectric thin-film 30 is greater than or equal to 200 nm. Further, it is more desirable that the thickness of the piezoelectric thin-film 30 is greater than or equal to 500 nm.

In the piezoelectric element 1, the piezoelectric thin-film 30 has (100) single-orientation (a-axis single-orientation). When the piezoelectric thin-film 30 has (100) single-orientation, the piezoelectric performance by non-180-degree polarization rotation, such as 90-degree polarization rotation, is maximized.

In the piezoelectric element 1, the piezoelectric thin-film 30 is not particularly limited as long as the thickness of the piezoelectric thin-film 30 is greater than or equal to 200 nm and the piezoelectric thin-film 30 has tetragonal crystal structure. For example, the piezoelectric thin-film 30 may contain various kinds of perovskite-type oxides, which may be either lead-based perovskite-type oxides or lead-free perovskite-type oxides. The piezoelectric thin-film containing the perovskite-type oxide is a ferroelectric thin-film that has spontaneous polarization characteristic when no voltage is applied thereto.

As described in "Description of the Related Art" in the specification of the present application, a lead-free piezoelectric material that has excellent piezoelectric properties similar to that of the lead-based piezoelectric material needs to be developed. Further, as described above, the strain displacement amount of the lead-free piezoelectric materials is limited when only the ordinary electric-field-induced piezoelectric strain is utilized. However, since the piezoelectric element 1 can achieve the maximum piezoelectric performance by reversible non-180-degree domain rotation, such as 90-degree domain rotation, as described above, even if the piezoelectric thin-film 30 is made of a lead-free piezoelectric material, which has small ordinary electric-field-induced piezoelectric strain, it is possible to achieve high piezoelectric performance. For example, the lead-free piezoelectric thin-film 30 contains at least one kind of perovskite-type oxide selected from the group consisting of barium titanate, barium strontium titanate, barium titanate zirconate, bismuth potassium titanate, and bismuth ferrites.

Meanwhile, the lead-based piezoelectric thin-film 30 may contain a perovskite-type oxide represented by the following formula (P):

$$AaBbO_3 \quad \text{(P)}.$$

(In formula (P), A: A-site element that is at least one kind of element including Pb, B: B-site element that is at least one kind of element selected from the group consisting of Ti, Zr, V, Nb, Ta, Cr, Mo, W, Mn, Sc, Co, Cu, In, Sn, Ga, Zn, Cd, Fe, and Ni, and O; oxygen atom. Standard values of a and b are a=1.0 and b=1.0. However, the values of a and b may be different from 1.0 as long as the perovskite structure can be obtained.) In formula (P), the element for the a-site other than Pb is a lanthanide element, such as La, Ba or the like.

The piezoelectric thin-film 30 undergoes phase-transition at a phase-transition temperature (Curie temperature) Tc. When the temperature is higher than or equal to temperature Tc, the piezoelectric thin-film 30 is a paraelectric material, in which spontaneous polarization has disappeared. In the piezoelectric element 1, the crystal orientation of the piezoelectric thin-film 30 becomes (100) single-orientation by thermal tensile stress $\epsilon_{thermal}$ applied to the piezoelectric thin-film 30 while the temperature is dropping after the piezoelectric thin-film 30 is deposited. The thermal tensile stress $\epsilon_{thermal}$ is generated when the thermal expansion coefficient $\alpha_{sub}$ of the substrate 10 and the thermal expansion coefficient $\alpha_{film}$ of the piezoelectric thin-film 30 deposited on the substrate 10 satisfies $(\alpha_{film}-\alpha_{sub})>0$.

Therefore, the substrate 10 is not particularly limited as long as the substrate 10 has thermal expansion coefficient $\alpha_{sub}$ that can apply thermal tensile stress $\epsilon_{thermal}$ to the piezoelectric thin-film 30 so that the crystal orientation of the piezoelectric thin-film 30 becomes (100) single-orientation. Further, the thermal expansion coefficient $\alpha_{sub}$ required for the substrate 10 is appropriately selected based on the thermal expansion coefficient $\alpha_{film}$ of the piezoelectric thin-film 30 deposited on the substrate 10 and the deposition temperature Tg.

For example, when the piezoelectric thin-film 30 is a perovskite-type oxide thin-film, as described above, it is desirable that the piezoelectric thin-film 30 is formed at temperature Tg that is higher than or equal to the Curie temperature (phase-transition temperature) Tc of the piezoelectric thin-film 30 to obtain the piezoelectric thin-film 30 that has excellent crystalline characteristics and excellent piezoelectric performance. When the piezoelectric thin-film 30 is deposited at the temperature Tg that is higher than or equal to the temperature Tc, the piezoelectric thin-film 30 passes the Curie temperature Tc while the temperature drops after deposition. When thermal tensile stress $\epsilon_{thermal}$ is present at the time of phase-transition, the crystal orientation tends to be oriented in the direction of absorbing the thermal tensile stress $\epsilon_{thermal}$, in other words, the crystal orientation tends to become (100) plane orientation, in which the crystal axes are short in a direction perpendicular to the surface of the substrate 10 and long in a direction parallel to the surface of the substrate 10.

The thermal tensile stress $\epsilon_{thermal}$ applied to the piezoelectric thin-film 30 while the temperature is reaching the phase-transition temperature Tc can be represented by the following formula: $(\alpha_{film}-\alpha_{sub}(° C.^{-1}))\times(Tg-Tc\ (° C.))$. The inventors of the present invention investigated the value $(\alpha_{film}-\alpha_{sub})$ that gives thermal tensile stress $\epsilon_{thermal}$ to the piezoelectric thin-film 30 so as to realize (100) single-orientation of the piezoelectric thin-film 30, taking a general deposition temperature Tg of the piezoelectric thin-film 30 into consideration. Consequently, they have found that the thermal tensile stress $\epsilon_{thermal}$ and the value of $(\alpha_{film}-\alpha_{sub})$ required to realize (100) single-orientation of the piezoelectric thin-film 30 are influenced by the lattice constant ratio of the crystal axes of the piezoelectric thin-film 30 (the lattice constant ratio of c-axis to a-axis) $(C/a)_{film}$ (please refer to the example of the present invention, which will be described later). Table 1 shows a-axial lengths and c-axial lengths of major perovskite-type oxides and the ratios of the lengths (lattice constant ratios of the crystal axes). In Table 1, two different compositions of PZT are illustrated, because the values for PZT differ according to the compositions of the PZT.

TABLE 1

| | a-axial length (Å) | c-axial length (Å) | c/a |
|---|---|---|---|
| $BiFeCO_3$ | 3.980 | 4.010 | 1.0075 |
| $BaTiO_3$ | 3.989 | 4.029 | 1.0100 |
| $Pb(Zr_{0.52},Ti_{0.48})\ O_3$ | 4.036 | 4.146 | 1.0270 |
| $Pb(Zr_{0.44},Ti_{0.53})\ O_3$ | 4.017 | 4.139 | 1.0300 |
| $PbTiO_3$ | 3.896 | 4.136 | 1.0616 |

For example, when the piezoelectric thin-film 30 satisfies the following formula (1), if the substrate 10 that satisfies the following formula (2) is used, it is possible to obtain (100) single-orientation. The substrate 10 may be, for example, $LaAlO_3$(LAO)($\alpha_{sub}$(° C.$^{-1}$)=12.5×10$^{-6}$), $SrTiO_3$(STO) ($\alpha_{sub}$(° C.$^{-1}$)=11.1×10$^{-6}$), $NdGaO_3$(NGO)($\alpha_{sub}$(° C.$^{-1}$)=10.0×10$^{-6}$), $KTaO_3$(KTO)($\alpha_{sub}$(° C.$^{-1}$)=6.0×10$^{-6}$), Si($\alpha_{sub}$(° C.$^{-1}$)=3.0×10$^{-6}$) or the like. When an oxide single-crystal substrate is used, it is desirable that a (001) plane substrate is used. Further, the piezoelectric thin-film 30 that satisfies the following formula (1) may contain barium titanate ($BaTiO_3$), barium strontium titanate ($(Ba,Sr)TiO_3$), barium titanate zirconate ($Ba(Ti,Zr)O_3$), bismuth potassium titanate ($(Bi,K)TiO_3$), and bismuth ferrites ($BiFeO_3$) or the like:

$$1.0<(c/a)_{film}\leq 1.015 \quad (1);\ \text{and}$$

$$\alpha_{film}-\alpha_{sub}(° C.^{-1})\geq 3.0\times10^{-6} \quad (2),$$

where $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film in formulas (1) and (2).

Further, when the piezoelectric thin-film 30 satisfies the following formula (3), if the substrate 10 that satisfies the following formula (4) is used, it is possible to obtain (100) single-orientation. The substrate 10 may be, for example, $KTaO_3(\alpha_{sub}(° C.^{-1})=6.0\times10^{-6})$, $Si(\alpha_{sub}(° C.^{-1})=3.0\times10^{-6})$ or the like. Further, the piezoelectric thin-film 30 satisfying the following formula (3) may contain a part of perovskite-type oxides, such as lead titanate zirconate (PZT), represented by the above formula (P):

$$1.015<(c/a)_{film}\leq1.045 \quad (3);$$

$$\alpha_{film}-\alpha_{sub}(° C.^{-1})\geq9.0\times10^{-6} \quad (4),$$

where $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film in formulas (3) and (4).

Further, when the piezoelectric thin-film 30 satisfies the following formula (5), if the substrate 10 that satisfies the following formula (6) is used, it is possible to obtain (100) single-orientation. The substrate 10 may be $Si(\alpha_{sub}(° C.^{-1})=3.0\times10^{-6})$ or the like. Further, the piezoelectric thin-film 30 that satisfies the following formula (5) may contain a part of perovskite-type oxides, such as lead titanate ($PbTiO_3$), represented by the above formula (P):

$$1.045<(c/a)_{film}\leq1.065 \quad (5)$$

$$\alpha_{film}-\alpha_{sub}(° C.^{-1})\geq12.0\times10^{-6} \quad (6),$$

where $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film in formulas (5) and (6).

Figure 6:
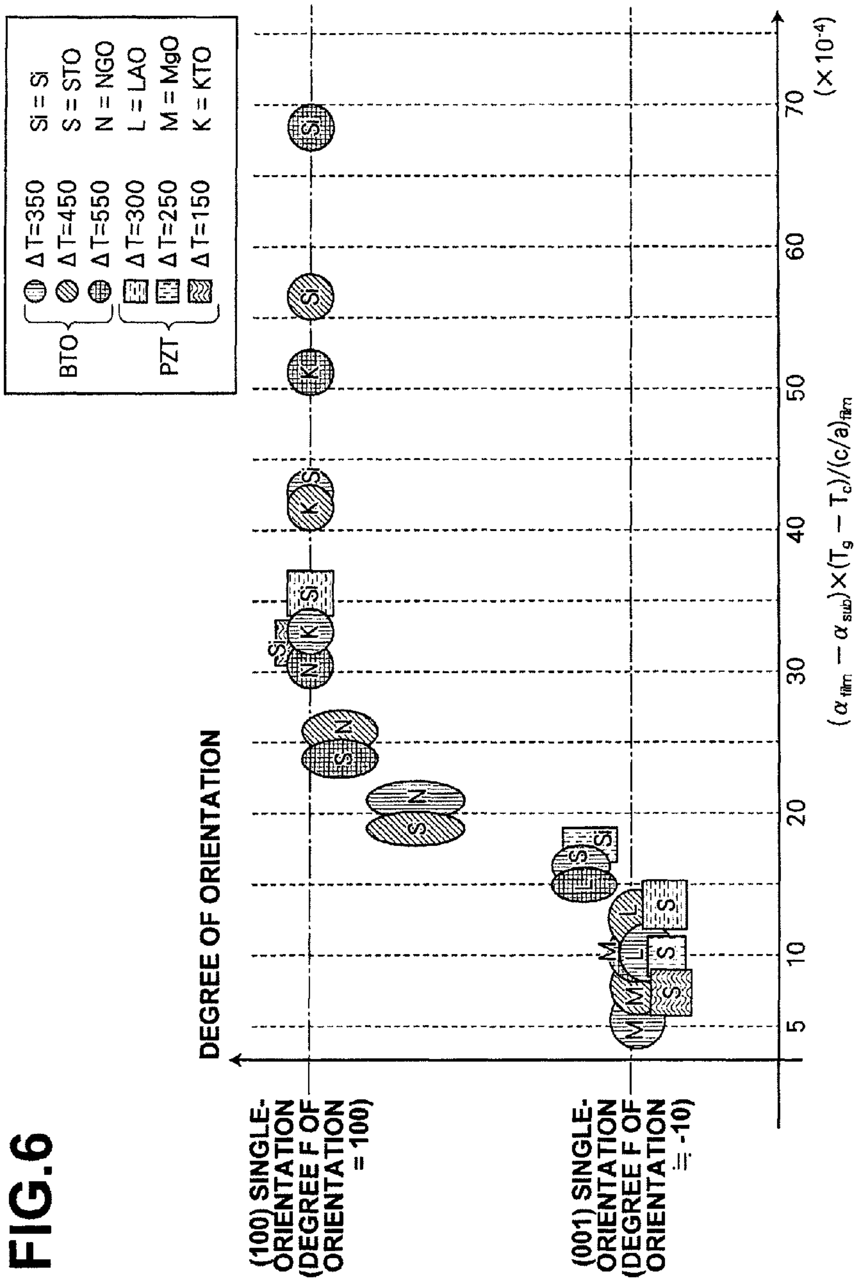
FIG. 6 is a diagram illustrating the result obtained in Example 1, and plotting the degree of (100) orientation with respect to the thermal stress (a value normalized using a lattice constant ratio) applied to each thin-film while the temperature reaches the Curie temperature thereof.

The aforementioned conditions of the substrates 10 were obtained by depositing the piezoelectric thin-films 30 satisfying the formulas (1), (3) and (5) respectively on the substrates 10 that had different thermal expansion coefficients $\alpha_{sub}$ from each other in the range of general deposition temperatures Tg of the piezoelectric thin-films 30, and by examining the crystal orientation characteristics of the obtained piezoelectric thin-films 30 (Example 1, FIG. 6). As FIG. 6 shows, when the substrate 10 was a Si substrate, a piezoelectric thin-film 30 that had (100) single-orientation was obtained regardless of the deposition temperature, in other words, at any deposition temperature. However, when the substrate 10 was not the Si substrate, if the deposition temperature Tg was low, in other words, if the difference between the deposition temperature Tg and the Curie temperature Tc was not sufficient, it was impossible to obtain (100) single-orientation in some cases.

Therefore, the value of thermal tensile stress $\epsilon_{thermal}$ for obtaining (100) single-orientation thin-film was estimated in a relatively wide range of thermal expansion coefficients $\alpha_{film}$. Consequently, it has been found that when the following formula (7) is satisfied, and optionally, when the following formula (8) is satisfied, the piezoelectric thin-film 30 can have (100) single-orientation (please refer to the example that will be described later):

$$(\alpha_{film}-\alpha_{sub}(° C.^{-1}))\times(Tg-Tc(° C.))/(c/a)_{film}>25\times10^{-4} \quad (7);$$

$$(\alpha_{film}-\alpha_{sub}(° C.^{-1}))\times(Tg-Tc(° C.))/(c/a)_{film}\geq30\times10^{-4} \quad (8),$$

where $\alpha_{sub}$ is the thermal expansion coefficient of the substrate, $\alpha_{film}$ is the thermal expansion coefficient of the ferroelectric thin-film, Tg is the deposition temperature of the ferroelectric thin-film, Tc is a phase-transition temperature, and $(c/a)_{film}$ is the lattice constant ratio of the crystal axes of the ferroelectric thin-film in formulas (7) and (8).

The crystal orientation of the substrate 10 is not particularly limited. However, since it is desirable that the piezoelectric thin-film 30 is an epitaxial layer that has crystal structure more close to single crystal, it is desirable that the piezoelectric thin-film 30 has crystal orientation that can enable epitaxial growth, and a single-crystal substrate is desirable.

Next, with reference to FIG. 2, an example of a method for producing the piezoelectric element 1 when the piezoelectric thin-film 30 is deposited at temperature Tg that is higher than or equal to temperature Tc will be described. Further, the crystal system, the orientation condition and the like of the domains of the piezoelectric thin-film 30 in the process of producing the piezoelectric element 1 will be described. FIG. 2 is a diagram illustrating the process of producing the piezoelectric element 1 (a sectional diagram in the thickness direction of the substrate). In FIG. 2, a piezoelectric element on which patterning has not been performed is used to explain the production process so that the process is easily recognized. In FIG. 2, the buffer layer 50 is omitted.

First, a substrate 10 that satisfies the above formula (1) and/or the above formula (2) is prepared based on the thermal expansion coefficient $\alpha_{film}$ of the piezoelectric thin-film 30 (step A in FIG. 2). Further, the lower electrode 20 is deposited on the substrate 10.

Next, a piezoelectric thin-film 30 is deposited on the lower electrode 20 at temperature Tg that is higher than or equal to phase-transition temperature Tc (step B in FIG. 2). The temperature of the piezoelectric thin-film 30 immediately after deposition is higher than or equal to the phase-transition temperature Tc. Therefore, the piezoelectric thin-film 30 has a crystal system other than the tetragonal crystal system. For example, when the piezoelectric thin-film 30 is made of a ferroelectric material, such as a perovskite-type oxide, a ferromagnetic material or the like, the temperature Tc is a Curie temperature. When the temperature of the piezoelectric thin-film 30 is higher than or equal to the temperature Tc, the piezoelectric thin-film 30 mainly has a cubic crystal system. At this temperature, the spontaneous polarization and the spontaneous magnetization of the piezoelectric thin-film 30 disappear, and the piezoelectric thin-film 30 is a paraelectric material or a paramagnetic material. Insteps B through D of FIG. 2, a domain 30D Of the piezoelectric thin-film 30 and the thermal tensile stress $\epsilon_{thermal}$ applied to the piezoelectric thin-film 30 are schematically illustrated, and a case in which the crystal system is a cubic crystal system when the temperature is higher than or equal to the temperature Tc is used as an example. The aforementioned lead-containing perovskite-type oxide has ferroelectric properties. As described in "Description of the Related Art" in the specification of the present application, it is desirable that the deposition temperature Tg is higher than or equal to the temperature Tc to obtain a perovskite-type oxide thin-film that has excellent crystalline properties. Therefore, an appropriate temperature should be selected based on the type and the composition of the piezoelectric thin-film 30 to be deposited.

As described above, the crystal orientation of the piezoelectric thin-film 30 is controlled by utilizing the stress induced by the difference between the thermal expansion coefficient of the substrate 10 and the thermal expansion coefficient of the piezoelectric thin-film 30, which is generated while the temperature is dropping after deposition of the piezoelectric thin-film 30. Therefore, as long as the crystal orientation can be controlled by utilizing the stress as described above, the method for depositing the piezoelectric thin-film 30 is not particularly limited. For example, the method for depositing the piezoelectric thin-film 30 may be a gas-phase method, such as a sputter method (sputtering method), a pulse laser deposition method (PLD method), and an MOCVD method, a liquid-phase method, such as a sol-gel method, or the like.

After the piezoelectric thin-film 30 is deposited, the piezoelectric thin-film 30 is naturally cooled down to room temperature through the phase-transition temperature Tc (Curie temperature). Therefore, for example, the piezoelectric thin-film 30 that has cubic crystal structure at the time of deposition undergoes phase-transition at the Curie temperature (Curie point) in the process of cooling the piezoelectric thin-film 30, and the crystal structure changes to tetragonal crystal structure. In the present invention, if the difference ($\alpha_{film}-\alpha_{sub}$) between the thermal expansion coefficient of the substrate 10 and the thermal expansion coefficient of the piezoelectric thin-film 30 is large, the contraction rate of the piezoelectric thin-film 30 is remarkably higher than the contraction rate of the substrate 10 in the process of cooling. When the temperature T of the piezoelectric thin-film 30 is in a range satisfying Tc<T<Tg, thermal strain caused by large thermal tensile stress $\epsilon_{thermal}$ is generated in the piezoelectric thin-film 30 in a direction perpendicular to the direction of the thickness of the piezoelectric thin-film (step C in FIG. 2).

The piezoelectric thin-film 30 has a tetragonal crystal system at room temperature that is lower than or equal to the phase-transition temperature Tc. Therefore, phase-transition occurs at the phase-transition temperature Tc, and the crystal system of the piezoelectric thin-film 30 changes to the tetragonal crystal system. In the vicinity of the temperature Tc, if thermal tensile stress $\epsilon_{thermal}$ is not applied to the piezoelectric thin-film 30, there is an influence of the lattice strain by lattice mismatch between the substrate 10 and the piezoelectric thin-film 30. However, when the thickness of the piezoelectric thin-film 30 is greater than or equal to 500 nm, the influence is small, and does not control the crystal orientation.

Meanwhile, at the time of phase-transition, in which the temperature T of the piezoelectric thin-film 30 becomes the temperature Tc, if thermal tensile stress $\epsilon_{thermal}$ is present, the crystal orientation tends to be oriented in the direction of absorbing the thermal tensile stress $\epsilon_{thermal}$, in other words, the crystal orientation tends to become (100) plane orientation, in which the crystal axes are short in a direction perpendicular to the surface of the substrate 10 and long in a direction parallel to the surface of the substrate 10.

At this time, if thermal tensile stress $\epsilon_{thermal}$ that is sufficient for the piezoelectric thin-film 30 to have (100) single-orientation is not generated, (001) orientation domains are mixed. However, when sufficient thermal tensile stress $\epsilon_{thermal}$ can be generated, in other words, when the aforementioned conditions are satisfied, it is possible to obtain the piezoelectric thin-film 30 that has (100) single-orientation (step D in FIG. 2).

Further, the upper electrode 40 is deposited on the obtained piezoelectric thin-film 30. Accordingly, the piezoelectric element 1 is produced (step E in FIG. 2).

Further, in the piezoelectric element 1, if the crystal plane at the surface of the substrate 10 is a surface that inclines from the low-index plane of the substrate 10, the piezoelectric thin-film 30 can have substantially uniform crystal orientation in a plane parallel to the surface of the substrate.

Figure 3A:
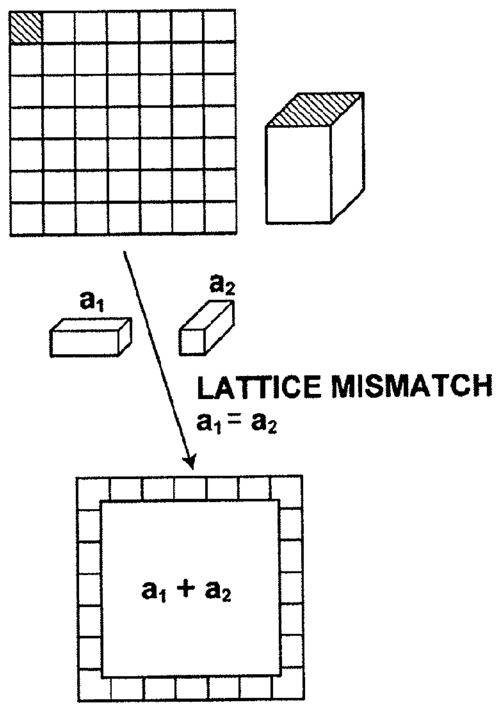
FIG. 3A is a diagram illustrating the atomic arrangement at the surface of an ordinary substrate and a domain orientation condition in a piezoelectric thin-film deposited on the substrate.
Figure 3B:
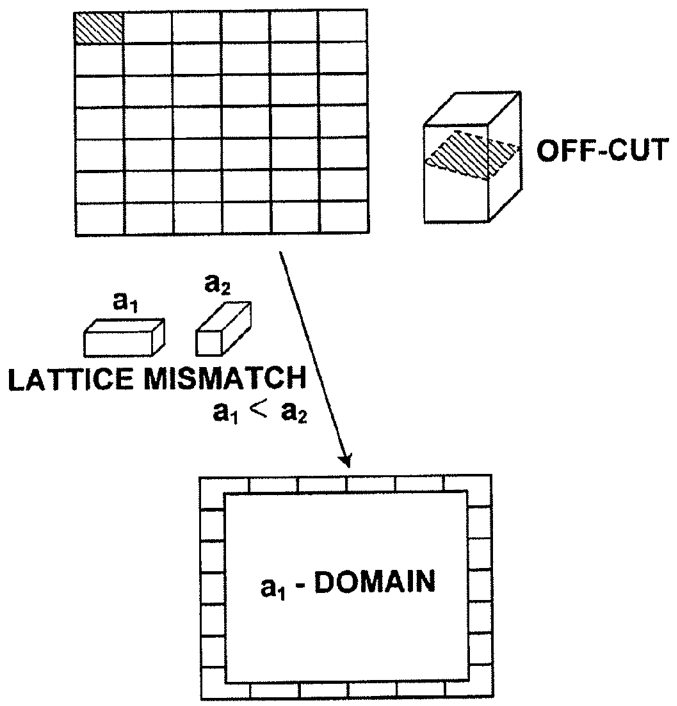
FIG. 3B is a diagram illustrating the atomic arrangement at the surface of a substrate, the surface having been formed by off-cutting the substrate, and a domain orientation condition in a piezoelectric thin-film deposited on the substrate.

FIGS. 3A and 3B schematically illustrate the arrangement of atoms at the surface of the substrate 10 and the domains of the piezoelectric thin-film 30 deposited on the substrate 10. The crystal orientation direction of the piezoelectric thin-film 30 deposited on the substrate 10 is influenced by the crystal lattice at the surface of the substrate 10.

When the piezoelectric thin-film 30 that has a tetragonal crystal system becomes a-axis-oriented by epitaxial growth, there are two matching directions (a1 and a2) with respect to the base substrate, as illustrated in FIGS. 3A and 3B. When the base substrate is (001) plane of a material having a cubic crystal system and a tetragonal crystal system, which is ordinarily used, lattice mismatch is the same regardless of the directions of the domains, namely, a1 or a2. Therefore, in the piezoelectric thin-film 30, $a_1$-domains and $a_2$-domains are mixed (FIG. 3A).

Meanwhile, when the crystal plane at the surface of the substrate 10 is formed by off-cutting the substrate 10 from a low-index plane of the substrate 10, the arrangement of the atoms at the surface of the substrate 10 is rectangular. In this case, since the lattice mismatch of a1 and the lattice mismatch of a2 differ from each other, the piezoelectric thin-film 30 selectively includes only one of the domains that has smaller lattice mismatch (in FIG. 3B, $a_1$-domains). Therefore, the piezoelectric thin-film 30 has uniform crystal orientation also in the in-plane direction (FIG. 3B).

As illustrated in FIG. 3B, when the piezoelectric thin-film 30 has uniform crystal orientation also in the in-plane direction, the in-plane uniformity of the obtained piezoelectric properties is high. Therefore, the piezoelectric element 1 that has excellent properties can be obtained.

In the piezoelectric element (a ferroelectric element and a ferroelectric oxide structure) 1, the piezoelectric thin-film (ferroelectric thin-film) 30 that has a thickness of greater than or equal to 200 nm and a tetragonal crystal system is provided on the substrate 10, and the piezoelectric thin-film 30 has (100) single-orientation crystal orientation. In this structure, the crystal orientation of the piezoelectric thin-film 30 that has the thickness of greater than or equal to 200 nm and a tetragonal crystal system is (100) single orientation. Therefore, it is possible to maximize the function of the ferroelectric thin-film based on (100) single orientation, such as the effect of non-180-degree domain rotation. The example of the non-180-degree domain rotation is 90 degree domain rotation or the like. Therefore, in a ferroelectric oxide structure, such as a ferroelectric element, which desirably includes a ferroelectric thin-film that has a thickness of greater than or equal to 200 nm and a tetragonal crystal system because of the device characteristics, it is possible to optimize the characteristics of the device based on (100) orientation. The example of the ferroelectric element is a piezoelectric element, a pyroelectric element or the like.

Further, as the method for producing the piezoelectric element 1, the present invention has discovered that when the piezoelectric thin-film 30 that has a thickness of greater than or equal to 200 nm and a tetragonal crystal system is deposited, the piezoelectric thin-film that has (100) single-orientation can be formed by optimizing the difference between the thermal compression stress of the substrate 10 and the thermal compression stress of the piezoelectric thin-film 30 and the difference between the thermal expansion coefficient of the substrate 10 and the thermal expansion coefficient of the piezoelectric thin-film 30. According to the method for producing the piezoelectric element 1, it is possible to make the piezoelectric thin-film 30 have (100) single orientation in a ferroelectric element, such as a piezoelectric element and a pyroelectric element, which desirably includes the piezoelectric thin-film 30 that has a thickness of greater than or equal to 200 nm and a tetragonal crystal system because of the device characteristics.

With respect to a ferroelectric thin-film that has a thickness of greater than or equal to 200 nm and a tetragonal crystal system, obtainment of a (100) single-orientation thin-film has not been reported before the present invention. Therefore, the ferroelectric oxide structure 1 per se, in which the (100) single-orientation ferroelectric thin-film 30 that has a thickness of greater than or equal to 200 nm and a tetragonal crystal system is provided on the substrate 10, is novel.

"Inkjet-Type Recording Apparatus"

Figure 4:
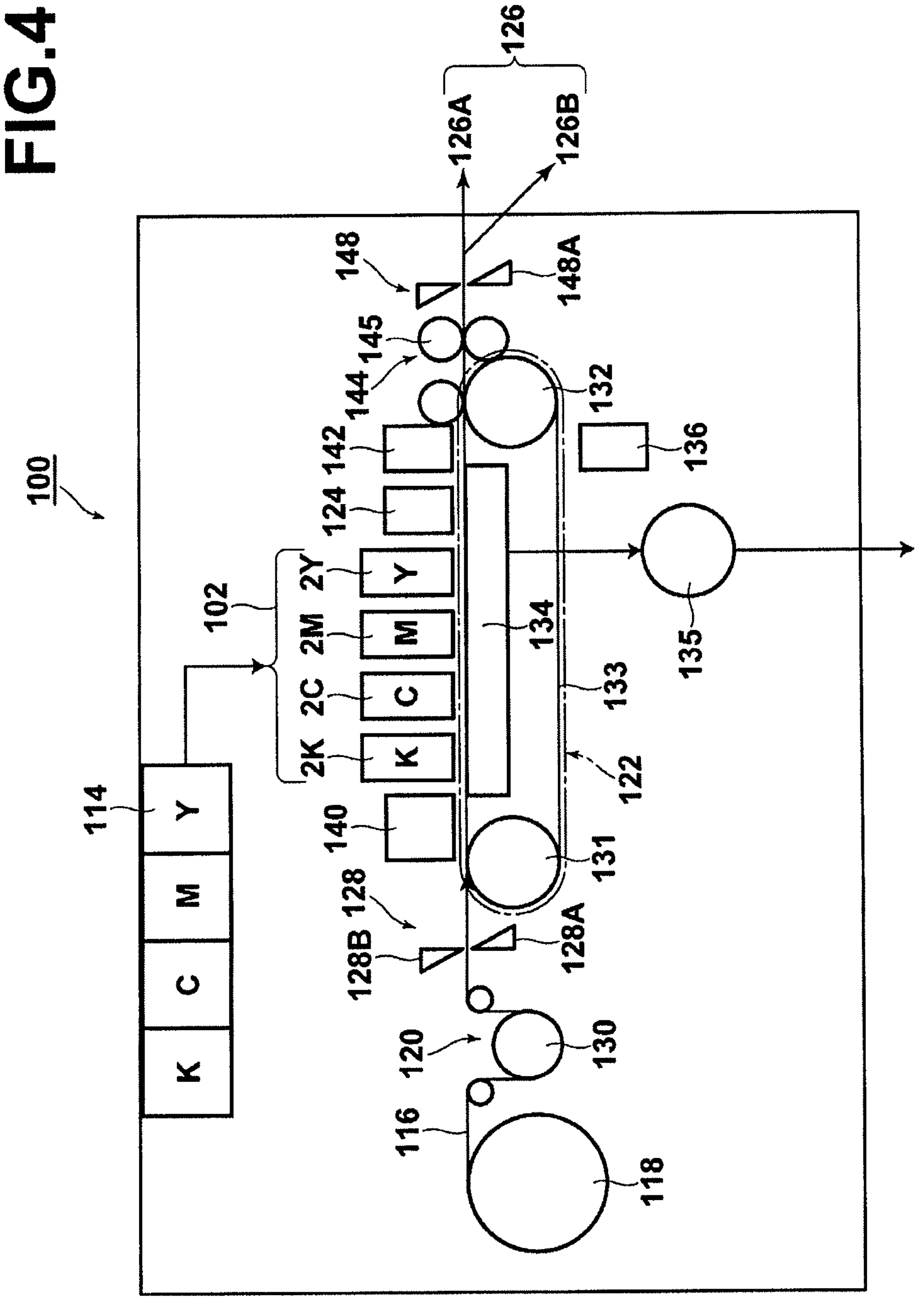
FIG. 4 is a diagram illustrating an example of the structure of an inkjet-type recording apparatus including an inkjet-type recording head (liquid discharge apparatus)
Figure 5:
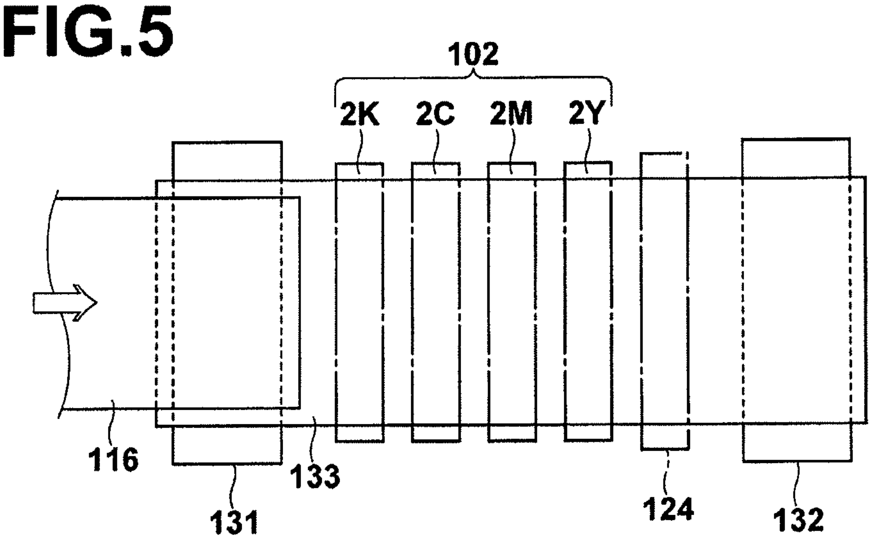
FIG. 5 is a diagram illustrating a partial top view of the inkjet-type recording apparatus illustrated in FIG. 4.

With reference to FIGS. 4 and 5, an example of the structure of an inkjet-type recording apparatus including an inkjet-type recording head 2 according to the aforementioned embodiment will be described. FIG. 4 is a diagram illustrating the whole apparatus, and FIG. 5 is a diagram showing a partial top view of the apparatus.

An inkjet-type recording apparatus 100, illustrated in FIGS. 4 and 5, includes a print unit 102, an ink storage/load unit 114, a paper-feed unit 118, a decurl process unit 120, a suction belt conveyance unit 122, a print detection unit 124, and a paper-discharge unit 126. The print unit 102 includes a plurality of inkjet-type recording heads (hereinafter, simply referred to as "head or heads") 2K, 2C, 2M and 2Y, which are provided for respective colors. The ink storage/load unit 114 stores ink to be supplied to each of the heads 2K, 2C, 2M and 2Y. The paper-feed unit 118 supplies recording paper 116, and the decurl process unit 120 removes curl from the recording paper 116. The suction belt conveyance unit 122 is arranged so as to face the nozzle surface (ink discharge surface) of the print unit 102, and conveys the recording paper 116 in such a manner to maintain the flatness of the recording paper 116. The print detection unit 124 reads out the result of printing by the print unit 102. The paper-discharge unit 126 discharges the recording paper (printed paper) after printing to the outside of the inkjet-type recording apparatus 100.

Each of the heads 2K, 2C, 2M, 2Y, which constitute the print unit 102, is the inkjet-type recording head 2 of the aforementioned embodiment.

In the decurl process unit 120, the recording paper 116 is heated by a heating drum 130 in a direction opposite to the curl direction of the recording paper 116 to perform decurl processing.

When the apparatus uses roll paper, a cutter 128 for cutting paper is provided at a stage after the decurl process unit 120, as illustrated in FIG. 4. The cutter 128 cuts the roll paper into a desirable size, and the cutter 128 includes a fixed blade 128A and a round blade (rotary blade) 128B. The length of the fixed blade 128A is longer than or equal to the width of the conveyance path of the recording paper 116, and the round blade 128B moves along the fixed blade 128A. The fixed blade 128A is provided on the back side (non-printing side) of the recording paper 116, and the round blade 128B is provided on the print side of the recording paper 116 with the conveyance path of the recording paper 116 between the fixed blade 128A and the round blade 128B. When cut paper is used, the cutter 128 is not needed.

After the recording paper is decurled and cut, the cut recording paper is sent to the suction belt conveyance unit 122. The suction belt conveyance unit 122 is structured in such a manner that an endless belt 133 is wound about rollers 131 and 132. Further, at least portions of the suction belt conveyance unit 122 that face the nozzle surface of the print unit 102 and a sensor plane of the print detection unit 124 are horizontal (flat surface).

The width of the belt 133 is wider than that of the recording paper 116, and a multiplicity of suction holes (not illustrated) are formed in the belt surface. Further, a suction chamber 134 is provided on the inside of the belt 133 that has been wound about the rollers 131 and 132. The suction chamber 134 is provided at a position that faces the nozzle surface of the nozzle portion 102 and the sensor surface of the print detection unit 124. The suction chamber 134 is sucked by a fan 135, and negative pressure is applied to the suction chamber 134. Accordingly, the recording paper 116 on the belt 133 is sucked and held by the suction chamber 134.

When power is transmitted from a motor (not illustrated) to one of the rollers 131 and 132, about which the belt 133 is wound, the belt 133 is driven in the clockwise direction in FIG. 5, and the recording paper 116 held on the belt 133 is conveyed from the left to the right of FIG. 5.

When borderless print or like is performed, ink attaches also to the belt 133. Therefore, a belt cleaning unit 136 is provided at a predetermined position (an appropriate position that is not in a print area) on the outside of the belt 133.

Further, a heating fan 140 is provided on the upstream side of the print unit 102 in a paper conveyance path formed by the suction belt conveyance unit 122. The heating fan 140 sends heated air to the recording paper 116 to heat the recording paper 116 before printing. Since the recording paper 116 is heated immediately before printing, ink deposited on the recording paper 116 quickly dries.

The print unit 102 is a so-called full-line-type head, in which a line-type head is arranged in a direction (main-scan direction) orthogonal to the paper feed direction, and the length of the line-type head corresponds to the maximum width of the paper (please refer to FIG. 5). Each of the print heads 2K, 2C, 2M and 2Y is composed of a line-type head, in which a plurality of ink outlets (nozzles) are arranged. The plurality of ink outlets are arranged at least for a length exceeding a side of the recording paper 116 of the maximum target size of the inkjet-type recording apparatus 100.

The heads 2K, 2C, 2M and 2Y are arranged from the upstream side along the feed direction of the recording paper 116. The heads 2K, 2C, 2M and 2Y correspond to color inks of black (K), cyan (C), magenta (M), and yellow (Y), respectively. While the recording paper 116 is conveyed, color ink is discharged from each of the heads 2K, 2C, 2M and 2Y. Accordingly, a color image is recording on the recording paper 116.

The print detection unit 124 includes a line sensor for imaging the result of ink output (ink deposition) by the print unit 102, and the like. The print detection unit 124 detects a bad discharge condition, such as nozzle clogging, based on the image of the ink output condition that has been read out by the line sensor.

Further, a post-dry unit 142 including a heating fan for drying the printed image surface or the like is provided at a stage after the print detection unit 124. Since the printed surface should not be in contact with anything before the ink dries, a method of blowing hot air onto the printed surface is desirable.

Further, at a stage after the post-dry unit 142, a heat/pressure unit 144 is provided to control the degree of the glossiness of the image surface. The heat/pressure unit 144 pressures the image surface by a pressure roller 145 while heating the image surface. The pressure roller 145 has a predetermined uneven pattern on the surface thereof. Accordingly, the uneven pattern is transferred onto the image surface.

A print (printed paper) obtained as described is output from the paper discharge unit 126. It is desirable that an image to be printed, which is a primary object of printing, and a test print are separately discharged. In the inkjet-type recording apparatus 100, a classification means (not illustrated) for switching the paper discharge paths is provided to send the print of the image to be printed and the test print to discharge units 126A and 126B, respectively.

When the image to be printed and the test print are printed on relatively large paper at the same time, and next to each other, a cutter 148 should be provided to remove the test print portion.

The inkjet-type recording apparatus 100 is structured as described above.

"Design Modification"

In the present invention, it is desirable that the ferroelectric thin-film has a thickness of greater than or equal to 200 nm because of the device characteristics. The present invention can be applied to the ferroelectric element, such as the piezoelectric element and the pyroelectric element in a desirable manner. In the above embodiments, a case in which the ferroelectric thin-film is a piezoelectric thin-film has been described. However, the embodiments of the present invention are not limited to the above embodiments. The present invention may be applied to a ferroelectric thin-film that has a thickness of greater than or equal to 200 nm and tetragonal crystal structure.

EXAMPLES

Examples of the present invention and comparative examples will be described.

Example 1

The following substrates having a size of 10 mm×10 mm square and a thickness of 0.5 mm were prepared:

Si substrate (thermal expansion coefficient $\alpha_{sub}$=3.0×$10^{-6}$);

KTO substrate (thermal expansion coefficient $\alpha_{sbu}$=6.0×$10^{-6}$);

NGO substrate (thermal expansion coefficient $\alpha_{sub}$=10.0×$10^{-6}$);

STO substrate (thermal expansion coefficient $\alpha_{sub}$=11.1×$10^{-6}$);

LAO substrate (thermal expansion coefficient $\alpha_{sub}$=12.5×$10^{-6}$); and MgO substrate (thermal expansion coefficient $\alpha_{sub}$=13.5×$10^{-6}$). Each of the above thermal expansion coefficients is an average thermal expansion coefficient when the temperature increases from room temperature to the deposition temperature of the ferroelectric thin-film.

Next, a PZT($Pb(Zr_{0.4},Ti_{0.6})O_3$) thin-film and BTO($BaTiO_3$) thin-film were deposited on each of the substrates by using a PLD method. The deposition conditions were as follows:

the temperatures of the substrates were 685° C., 585° C. and 485° C. for BTO, and 650° C., 500° C. and 400° C. for PZT;

the oxygen gas pressure was 13.4 Pa (100 mmTorr); and the laser oscillation strength was 200 mJ. Further, the thickness of the ferroelectric thin-film was approximately 0.8 μm. With respect to the Si substrate, an appropriate buffer layer was introduced so that the ferroelectric thin-film grew to have crystal orientation. Further, an $SrRuO_3$ thin-film, as a lower electrode, was formed on each of the substrates by epitaxial growth. Further, the ferroelectric thin-film (PZT thin-film and BTO thin-film) was deposited on the $SrRuO_3$ thin-film.

Further, X-ray diffraction measurement was carried out in the out-of-plane direction (direction of the thickness of the thin-film) and in the in-plane direction to obtain the lattice constant in the thickness direction and in the in-plane direction (parallel to the substrate surface), which is orthogonal to the thickness direction. According to the result of the measurement, it was confirmed that each of the ferroelectric thin-films deposited on the substrates had (100) or (001) preferred orientation.

Next, the degree of orientation of each of the ferroelectric thin-films was obtained based on XRD spectrum. The degree of orientation was obtained by determining the direction of orientation based on the XRD spectrums in the out-of-plane direction and in the in-plane direction. When the directions of orientation were mixed, the degree of orientation was calculated based on the ratio of the magnitudes of the XRD peaks (the formula used for this calculation is described in "Summary of the Invention" in the specification of the present application).

Consequently, it was confirmed that when both of the deposited material and the deposition temperature are the same, as the thermal expansion coefficient $\alpha_{sub}$ of the substrate is smaller, and as the deposition temperature Tg (substrate temperature) is higher, a-axis (100) orientation tends to occur more easily. This is because as the thermal expansion coefficient $\alpha_{sub}$ of the substrate is smaller, and as the deposition temperature Tg (substrate temperature) is higher, stress $\epsilon_{thermal}$ applied to the ferroelectric thin-film while the ferroelectric thin-film is cooled down to the Curie temperature after deposition is larger ($\epsilon_{thermal}=(\alpha_{film}-\alpha_{sub}(°\ C.^{-1}))\times(Tg-Tc(°\ C.))$.

Meanwhile, it was confirmed that when both of the deposition substrate and the deposition temperature Tg are the same, as the lattice constant ratio c/a (bulk value) of c-axis to a-axis of the material to be deposited is smaller, a-axis (100) orientation tends to occur more easily. This is because as the value of $(c/a)_{film}$ is larger, higher substrate stress is required to induce domain rotation.

Based on these results, it was confirmed that the degree of orientation of the deposited thin-film has correlations with the stress $\epsilon_{thermal}$ applied to the ferroelectric thin-film while the temperature is cooled down to the Curie temperature after deposition, and the lattice constant ratio c/a. FIG. 6 shows relationships between values $((\alpha_{film}-\alpha_{sub}(°\ C.^{-1}))\times(Tg-Tc(°\ C.))/(c/a)_{film})$ and the degrees of orientation with respect to the ferroelectric thin-films deposited on various substrates. The values $((\alpha_{film}-\alpha_{sub}(°\ C.^{-1}))\times(Tg-Tc(°\ C.))/(c/a)_{film})$ are obtained by normalizing $\epsilon_{thermal}$ by using lattice constant ratio $(c/a)_{film}$. As FIG. 6 shows, it was confirmed that in a region in the vicinity of $(\alpha_{film}-\alpha_{sub}(°\ C.^{-1}))\times(Tg-Tc(°\ C.))/(c/a)_{film})=25\times10^{-4}$, domain rotation occurs (the direction of orientation changes or reverses). Further, it was confirmed that when the value is greater than or equal to $(\alpha_{film}-\alpha_{sub}(°\ C.^{-1}))\times(Tg-Tc(°\ C.))/(c/a)_{film})=30\times10^{-4}$, sufficient a-axis (100) single-orientation is obtained.

Further, as FIG. 6 shows, it was confirmed that when the ferroelectric thin-film satisfies the following formula (1), if the ferroelectric thin-film is deposited on the substrate satisfying the following formula (2) based on the thermal expansion coefficient of the ferroelectric thin-film, it is possible to obtain a-axis (100) single-orientation thin-film. Further, it was confirmed that when the ferroelectric thin-film satisfies the following formula (3), if the ferroelectric thin-film is deposited on the substrate satisfying the following formula (4) based on the thermal expansion coefficient of the ferroelectric thin-film, it is possible to obtain a-axis (100) single-orientation thin-film. Further, it was confirmed that when the ferroelectric thin-film satisfies the following formula (5), if the ferroelectric thin-film is deposited on the substrate satisfying the following formula (6) based on the thermal expansion coefficient of the ferroelectric thin-film, it is possible to obtain a-axis (100) single-orientation thin-film:

$$1.0<(c/a)_{film}\leq 1.015 \quad (1);$$

$$\alpha_{film}-\alpha_{sub}(°\ C.^{-1})\geq 3.0\times 10^{-6} \quad (2);$$

$$1.015<(c/a)_{film}\leq 1.045 \quad (3);$$

$$\alpha_{film}-\alpha_{sub}(°\ C.^{-1})\geq 9.0\times 10^{-6} \quad (4);$$

$$1.045<(c/a)_{film}\leq 1.065 \quad (5);\ \text{and}$$

$$\alpha_{film}-\alpha_{sub}(°\ C.^{-1})\geq 12.0\times 10^{-6} \quad (6).$$

In formulas (1) through (6), $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film.

The ferroelectric oxide structure of the present invention can be applied to a piezoelectric element, such as an actuator, an ultrasound oscillator, and various kinds of sensors (pressure, acceleration, gyro, ultrasound or the like), a pyroelectric element, such as an infrared-ray sensor, a ferroelectric element, such as a ferroelectric memory, an optical element, such as a non-linear optical element and an electro-optic element, and the like.

What is claimed is:

1. A method for producing a ferroelectric oxide structure that has a substrate and a ferroelectric thin-film deposited on the substrate, wherein the crystal structure of the ferroelectric thin-film undergoes phase-transition at a predetermined temperature, and wherein the ferroelectric thin-film has a thickness of greater than or equal to 200 nm and a tetragonal crystal system when the temperature of the ferroelectric thin-film is less than or equal to the predetermined temperature, the method comprising the steps of:

preparing the substrate that satisfies the following formula (2) based on the thermal expansion coefficient of the ferroelectric thin-film when the ferroelectric thin-film satisfies the following formula (1);

preparing the substrate that satisfies the following formula (4) based on the thermal expansion coefficient of the ferroelectric thin-film when the ferroelectric thin-film satisfies the following formula (3);

preparing the substrate that satisfies the following formula (6) based on the thermal expansion coefficient of the ferroelectric thin-film when the ferroelectric thin-film satisfies the following formula (5); and depositing the ferroelectric thin-film on the substrate at a temperature higher than or equal to the predetermined temperature, wherein the formulas (1) through (6) are $$1.0<(c/a)_{film}\leq 1.015 \quad (1),$$

$$\alpha_{film}-\alpha_{sub}(°\ C.^{-1})_{film}\geq 3.0\times 10^{-6} \quad (2),$$

$$1.015<(c/a)_{film}\leq 1.045 \quad (3),$$

$$\alpha_{film}-\alpha_{sub}(°\ C.^{-1})\geq 9.0\times 10^{-6} \quad (4),$$

$$1.045<(c/a)_{film}\leq 1.065 \quad (5),$$

$$\alpha_{film}-\alpha_{sub}(°\ C.^{-1})\geq 12.0\times 10^{-6} \quad (6),$$

where $(c/a)_{film}$ is the lattice constant ratio of the crystal axes of the ferroelectric thin-film, $\alpha_{sub}$ is the thermal expansion coefficient of the substrate, and $\alpha_{film}$ is the thermal expansion coefficient of the ferroelectric thin-film in formulas (1) through (6).

2. A method for producing a ferroelectric oxide structure that has a substrate and a ferroelectric thin-film deposited on the substrate, wherein the crystal structure of the ferroelectric thin-film undergoes phase-transition at a predetermined temperature, and wherein the ferroelectric thin-film has a thickness of greater than or equal to 200 nm and a tetragonal crystal system when the temperature of the ferroelectric thin-film is less than or equal to the predetermined temperature, the method comprising the steps of:

preparing the substrate that satisfies the following formula (7) based on the thermal expansion coefficient of the ferroelectric thin-film and the lattice constant ratio of the crystal axes of the ferroelectric thin-film; and depositing the ferroelectric thin-film on the substrate at a temperature higher than or equal to the predetermined temperature, wherein the formula (7) is $$(\alpha_{film}-\alpha_{sub}(°\ C.^{-1}))\times(Tg-Tc(°\ C.))/(c/a)_{film})>25\times 10^{-4} \quad (7),$$

where $\alpha_{sub}$ is the thermal expansion coefficient of the substrate, $\alpha_{film}$ is the thermal expansion coefficient of the ferroelectric thin-film, Tg is the deposition temperature of the ferroelectric thin-film, Tc is a phase-transition temperature, and $(c/a)_{film}$ is the lattice constant ratio of the crystal axes of the ferroelectric thin-film in formula (7).

3. A method for producing a ferroelectric oxide structure, as defined in claim 2, the method comprising the steps of:

preparing the substrate that satisfies the following formula (8) based on the thermal expansion coefficient of the ferroelectric thin-film and the lattice constant ratio of the crystal axes of the ferroelectric thin-film; and depositing the ferroelectric thin-film on the substrate at a temperature higher than or equal to the predetermined temperature, wherein the formula (8) is $$(\alpha_{film}-\alpha_{sub}(°\ C.^{-1}))\times(Tg-Tc(°\ C.))/(c/a)_{film})\geq 30\times 10^{-4} \quad (8),$$

where $\alpha_{sub}$ is the thermal expansion coefficient of the substrate, $\alpha_{film}$ is the thermal expansion coefficient of the ferroelectric thin-film, Tg is the deposition temperature of the ferroelectric thin-film, Tc is a phase-transition temperature, and $(c/a)_{film}$ is the lattice constant ratio of the crystal axes of the ferroelectric thin-film in formula (8).

* * * * *